US007888776B2

(12) United States Patent
Ogawa et al.

(10) Patent No.: US 7,888,776 B2
(45) Date of Patent: Feb. 15, 2011

(54) CAPACITOR-BASED METHOD FOR DETERMINING AND CHARACTERIZING SCRIBE SEAL INTEGRITY AND INTEGRITY LOSS

(75) Inventors: Ennis T. Ogawa, Austin, TX (US); Honglin Guo, Plano, TX (US); Joe W. McPherson, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/165,419

(22) Filed: Jun. 30, 2008

(65) Prior Publication Data

US 2009/0321734 A1    Dec. 31, 2009

(51) Int. Cl.
    *H01L 23/544* (2006.01)
(52) U.S. Cl. .................. 257/620; 257/48; 257/E21.523; 438/460
(58) Field of Classification Search .................. 257/620, 257/E21.523, 48; 438/460
    See application file for complete search history.

(56) References Cited

U.S. PATENT DOCUMENTS 6,881,597 B2 * 4/2005 Asayama et al. ............... 438/18

| 7,005,733 | B2 * | 2/2006 | Kommerling et al. | 257/679 |
| 7,242,080 | B2 * | 7/2007 | Matsuno | 257/679 |
| 2003/0148597 | A1 * | 8/2003 | Tan et al. | 438/612 |
| 2006/0145347 | A1 * | 7/2006 | Aida | 257/758 |

OTHER PUBLICATIONS

"Moisture Related Low-K Dielectric Reliability Before and After Thermal Annealing", Yunlong Li, Ivan Ciofi, Laureen Carbonell, Guido Groeseneken, Karen Maex and Zsolt Tökei, IEEE 45$^{th}$ Annual International Reliability Physics Symposium, Phoenix, 2007, pp. 405-409.

* cited by examiner

*Primary Examiner*—Wael M Fahmy
*Assistant Examiner*—John C Ingham
(74) *Attorney, Agent, or Firm*—Warren L. Franz; Wade J. Brady, III; Frederick J. Telecky, Jr.

(57) ABSTRACT

One embodiment of the present invention relates to a scribe seal integrity detector. In this embodiment a scribe seal integrity detector is formed in an integrated circuit chip die. The scribe seal integrity comprises a scribe seal structure that extends along at least a portion of the periphery of the integrated chip die and a detector test structure. The detector test structure and the scribe seal form an electrical system configured to be accessed for a monitoring of one or more electrical parameters to determine and characterize scribe seal integrity of the integrated circuit chip die. The results of the electric measurements are analyzed for statistically relevant reliability characterization. Other methods and circuits are also disclosed.

19 Claims, 7 Drawing Sheets

CAPACITOR-BASED METHOD FOR DETERMINING AND CHARACTERIZING SCRIBE SEAL INTEGRITY AND INTEGRITY LOSS

FIELD OF INVENTION

The invention relates generally to integrated circuit chips and in particular to testing for potential damage to active regions of integrated circuit chips caused by propagation of cracks initiated through wafer dicing or generated by high thermomechanical stresses associated with die assembly and packaging.

BACKGROUND OF THE INVENTION

Semiconductor products, such as integrated circuit chips, are typically fabricated in large numbers on a single semiconductor body (i.e., a wafer). Fabrication using a single semiconductor body allows manufacturers using larger wafers to increase throughput while decreasing the cost of fabricating an individual chip.

FIG. 1A shows an example integrated circuit chip wafer 100. On the wafer 100, individual chips or dies are fabricated in a repeating pattern adjacent to one another and across the wafer. After the front end of the line and back end of the line processing steps are completed, the wafer 100 is divided, along kerf lines 102, into a number of individual chips or dies 104. Each of the dies 104 is subsequently integrated into a package by wire bond or flip chip connections. The package provides the chip protection, heat dissipation, and connections to the outside world.

The division of an integrated circuit chip wafer 100 into individual dies 104 is usually termed "dicing" or "sawing" the wafer. Dicing the wafer 100 is usually done using a resin-bonded diamond saw to cut along the kerf lines 102. During such sawing, the integrated circuit chip wafer 100 undergoes stress. The stress of dicing frequently damages the outer regions of the die 104 adjacent to the kerf lines 102. The damage can generate micro-cracks in the semiconductor substrate or cause delamination between the interface of the substrate and an overlying dielectric layer or between any of the overlying dielectric and metallization layers. If proper protection is not employed on the chip, micro-cracks or delamination will propagate into the electrically active regions of a chip. In the active region micro-cracks or delamination can expose metal lines and dielectric materials to ambient environment, causing corrosion and oxidation of metallization levels, thereby damaging circuitry, lowering production yield, and, most problematically, potentially inducing product failures out in the field.

Damage to the dies from dicing is an increasing problem as minimum feature sizes continue to shrink. Chip manufacturers have struggled to continue to meet the scaling demands of emerging technology nodes to which designs are driven by the industry and Moore's law. To meet the scaling demands, emerging technologies have begun to widely use low-k and ultra low-k (ULK) dielectric materials. Such low-k dielectric materials allow tighter pitch on metal and contact levels without substantially raising the capacitance associated with the back end of the line metallization. However, such low-k dielectric materials do not provide the same degree of mechanical support offered by higher k dielectric materials. Therefore, the increased use of mechanically weaker low-k dielectric materials indicates an increased risk towards crack generation during and propagation after wafer dicing.

FIG. 1B shows the different regions of a single integrated circuit chip die 104. In an integrated circuit chip die 104, the active circuitry 106 is located in the central part of the die. To prevent micro-crack propagation, protection structures called scribe seals are designed and placed in a scribe seal region 108 located along the outer border or periphery of the die 104. Traditionally, scribe seal structures have been employed to prevent large cracks from entering into the active circuitry 106 of the integrated circuit chip. Accordingly, scribe seal integrity loss has focused on large scale damage that is often detected through visual inspection. Finite element simulations are also used to determine how cracks will propagate through the die. However, the use of such methods identifies only gross levels of damage, and is not sensitive enough to do statistically meaningful reliability characterization.

Therefore, there is a need for a method and structure that allows statistically relevant reliability characterization of scribe seal damage.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the present invention relates to a scribe seal integrity detector comprising a detector test structure formed adjacent to an inner wall of a scribe seal. The inner wall of the scribe seal comprises vertically extending back end of the line metal and via levels. The detector test structure is formed laterally adjacent to an inner edge of the inner wall of the scribe seal facing a center portion of the integrated circuit chip die and also comprises vertically extending back end of the line metal and via levels. The detector test structure and inner wall of the scribe seal are coupled to at least one bond pad, thereby allowing the electrical properties between the detector test structure and the inner wall to be monitored by external testing equipment. Deviations from expected values of electrical parameters, observed after dicing, indicate damage to the scribe seal.

The following description and annexed drawings set forth in detail certain illustrative aspects and implementations of the invention. These are indicative of but a few of the various ways in which the principles of the invention may be employed.

DETAILED DESCRIPTION

Figure 1A:
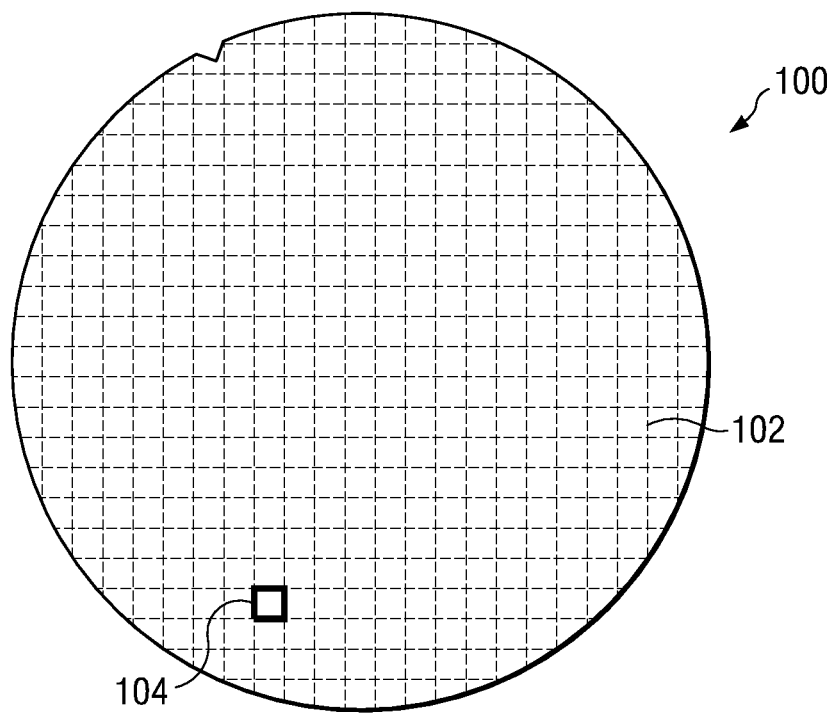
FIG. 1A shows a semiconductor wafer comprising multiple integrated circuit chip dies and kerf scribe lines.
Figure 1B:
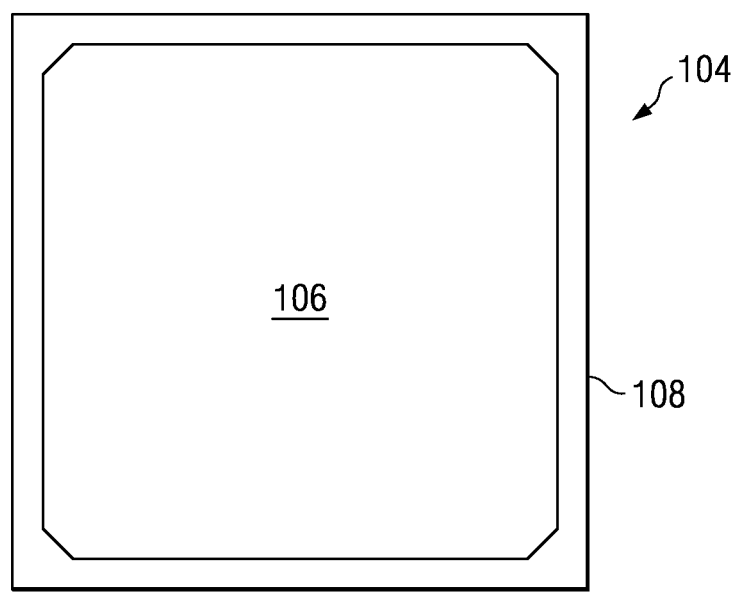
FIG. 1B identifies the scribe seal and active circuitry regions of an integrated circuit chip die.

The invention is described with reference to the attached drawing figures, wherein like reference numerals are used to refer to like elements throughout, and wherein the illustrated structures and devices are not necessarily drawn to scale.

Figure 2A:
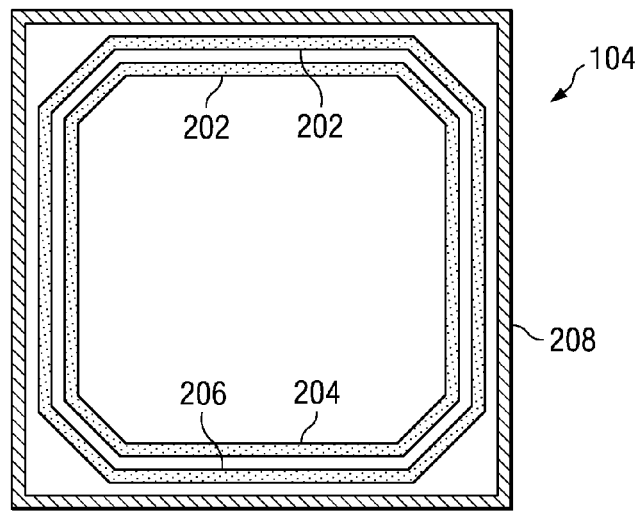
FIG. 2A shows a top view of a die having a scribe seal with an inner wall and an outer wall.
Figure 2B:
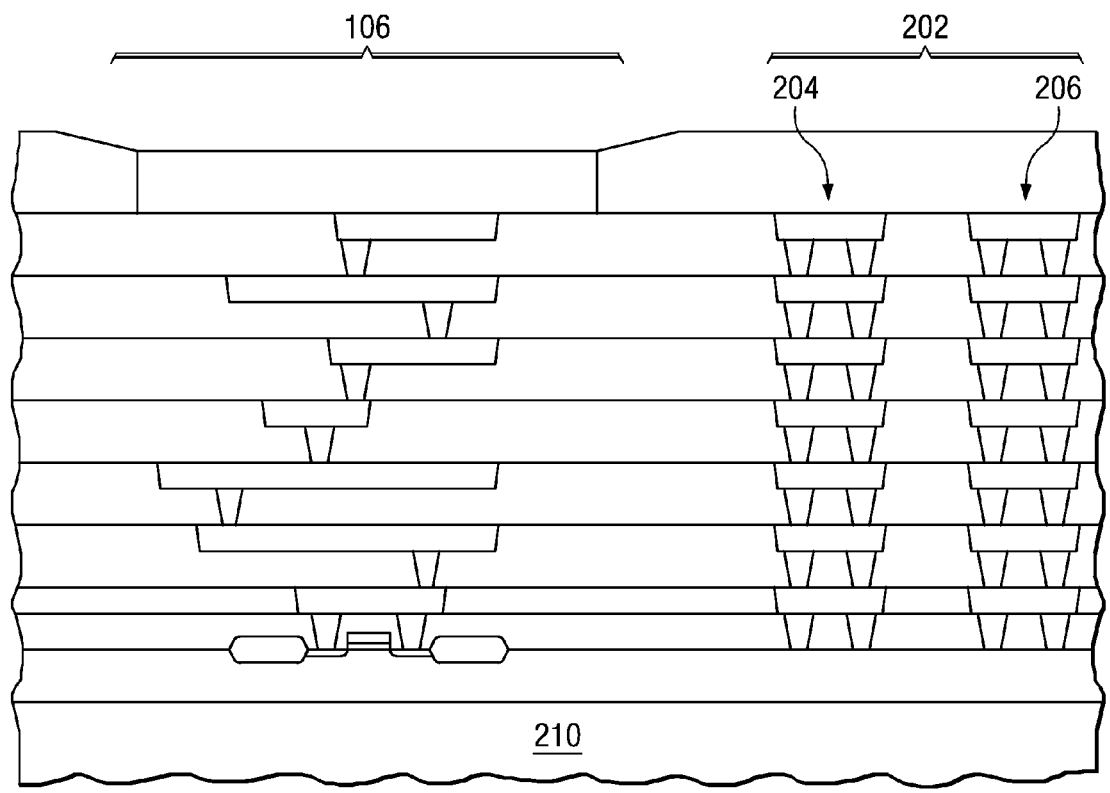
FIG. 2B shows a cross-sectional view of the scribe seal and active circuitry of the die of FIG. 2A.

FIGS. 2A and 2B show an integrated circuit chip die 104 comprising a scribe seal 202. In one embodiment, the scribe seal 202 is wrapped around and encompassing the active circuitry 106 of the integrated circuit chip. The structure of the scribe seal 202 can vary greatly depending on factors such as the area required by the active circuitry, the dielectric materials used with the metallization levels, test site results, etc. Scribe seals used in older technologies tend to be single wall structures, however as recent technology nodes have began to use dielectric materials with weaker mechanical strength, single-wall scribe seals are commonly too weak to prevent crack propagation. The scribe seal 202 shown in FIGS. 2A and 2B comprises two walls, an inner wall 204 and an outer wall 206. The exact structure of the scribe seal walls varies widely and all such variations are contemplated by the invention. In general, each of the inner wall 204 and outer wall 206 structures comprise a dense population of metallization levels as shown in FIG. 2B at 202. The dense population of metallization levels provides a barrier that resists crack propagation. However, cracks possessing sufficient energy can breach the scribe seal 202 and propagate into the active circuitry 106 of the die 104.

Figure 3:
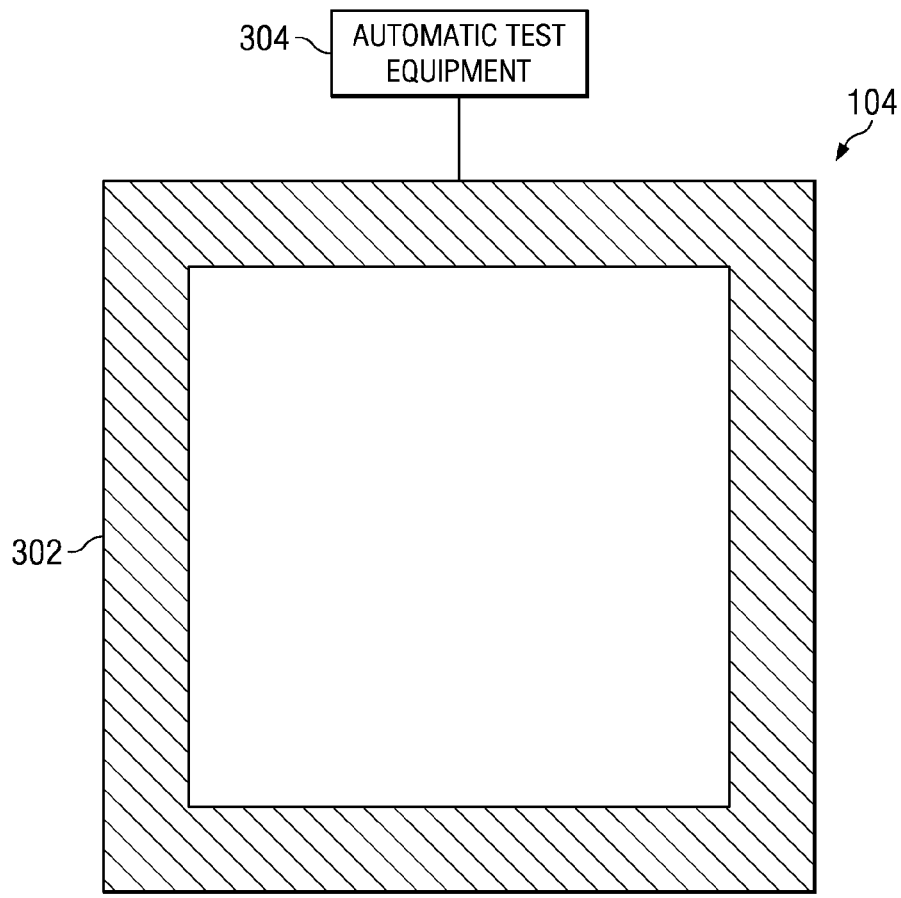
FIG. 3 shows a block diagram of a first embodiment of the invention, wherein a scribe seal integrity detector comprised within a die is configured to measure electrical parameters of the scribe seal.

FIG. 3 shows a first embodiment of the present invention, a scribe seal integrity detector 302 integrated into the die 104 of an integrated circuit chip. The scribe seal integrity detector 302 comprises a scribe seal structure that extends along at least a portion of the periphery of the integrated chip die and a detector test structure. The scribe seal structure and the detector test structure form an electrically coupled system that is configured to be accessed for a monitoring of one or more electrical parameters, thereby determining and characterizing scribe seal integrity. In one embodiment, the scribe seal integrity detector 302 detects crack propagation or delamination through the inner wall of the scribe seal. The scribe seal integrity detector 302 determines damage to the scribe seal by measuring electrical properties associated with the scribe seal region. For example, the scribe seal integrity detector 302 detects damage occurring to the dielectric material inside the inner wall of a scribe seal by detecting variations in the electrical parameters away from characterized values. The scribe seal integrity detector 302 measures such electrical parameters as DC capacitance, leakage current under bias, AC electrical impedance, etc., under fixed or varying ambient conditions such as temperature, pressure, and humidity variation, etc. In one embodiment, these electric parameters are measured by automatic test equipment 304 during normal chip testing and are analyzed for statistically relevant reliability characterization (e.g., a shift in the DC leakage beyond some nominal threshold). In another embodiment, the electrical parameters are measured using the scribe seal integrity detector 302 in conjunction with other testing methods such as burn-in, highly accelerated stress testing (HAST), high temperature storage, etc.

Figure 4A:
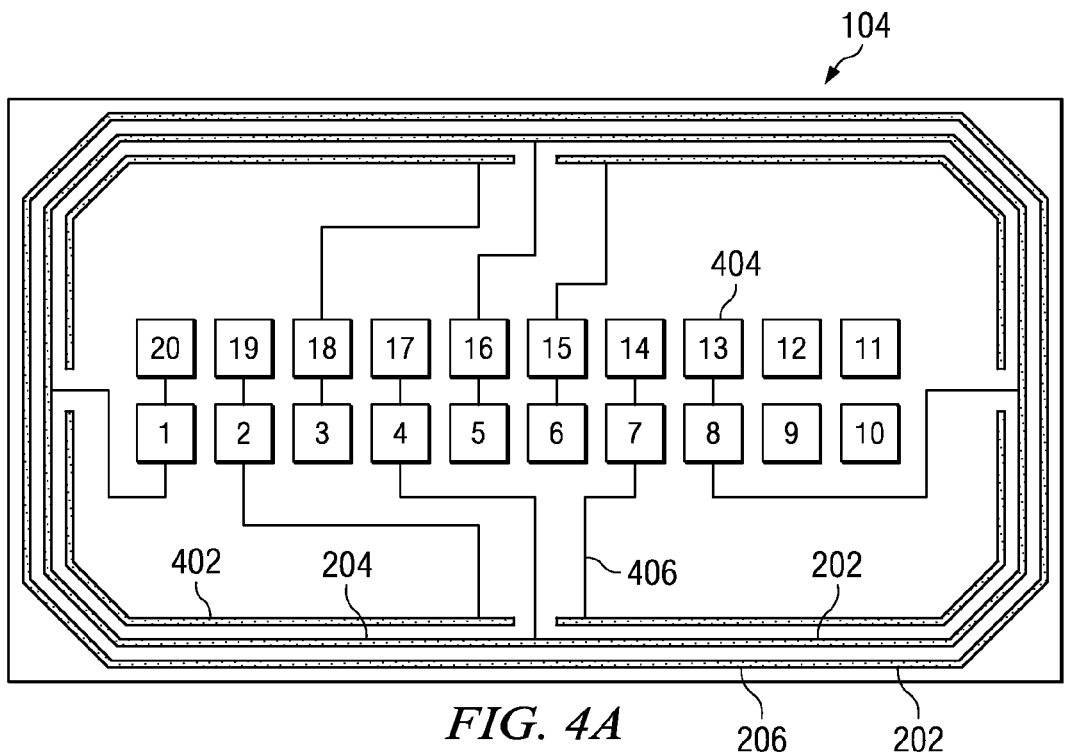
FIG. 4A. is a top view of one embodiment of the invention, wherein a detector test structure is placed laterally adjacent to an inner edge of an inner wall of the scribe seal facing a center portion of the integrated circuit chip die and electrical measurements are taken between the detector test structure and the inner wall.
Figure 4B:
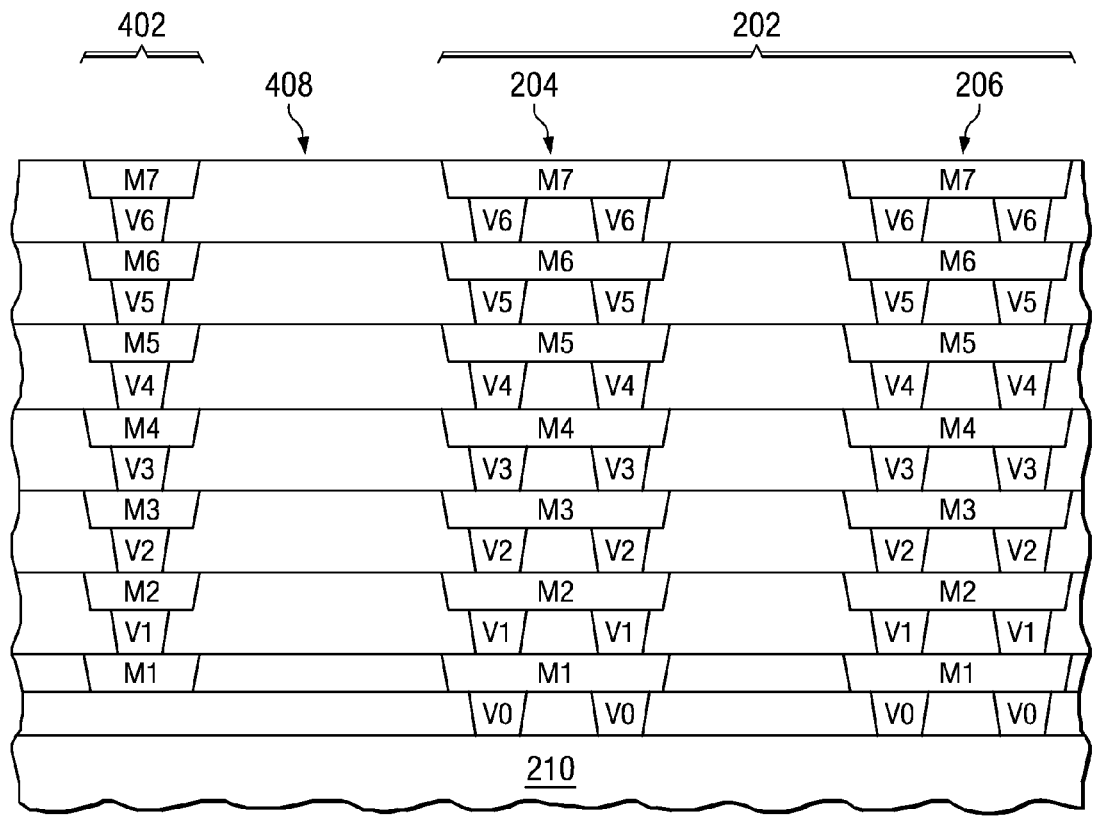
FIG. 4B is a cross-sectional view of the scribe seal and detector test structure of the die of FIG. 4A.

FIGS. 4A and 4B show an additional embodiment of the present invention, wherein a detector test structure 402, located along the inner wall 204 of the scribe seal, is added to the scribe seal. The detector test structure 402 and one wall of the scribe seal 202 are electrically coupled to at least one bond pad via connection 406. Electrical parameters of the coupled system comprising the scribe seal wall and detector test structure 402 are monitored to determine scribe seal integrity.

FIG. 4A shows a top view of a die 104 and scribe seal 202 comprising a scribe seal integrity detector. The scribe seal 202 shown in FIG. 4A is a two wall structure comprising an inner wall 204 and an outer wall 206. FIG. 4A further comprises an additional detector test structure 402 that is located laterally adjacent to an inner edge of the inner wall 204 of the scribe seal facing the center portion of the integrated circuit chip die 104 and is spaced apart from the inner wall 204 of the scribe seal by a space small enough to allow monitoring of electrical parameters, such as capacitance and leakage current under bias, between the two structures.

FIG. 4B shows a cross-sectional view of the scribe seal 202 and detector test structure 402. Dielectric material 408 separates the inner wall 204 of the scribe seal and the detector test structure 402. The dielectric material 408 is comprised of several dielectric layers in one embodiment. The dielectric layers comprise varying materials for the different metallization levels depending on the integration scheme used. For example, in one embodiment low-k dielectric layers are used for the lower thin metallization levels (e.g., M1-M3), while higher k, tetraethyl orthosilicate (TEOS), dielectric layers are used for the upper thick metallization levels (e.g., M4-M7) comprise.

Both the detector test structure 402 and the inner wall 204 of the scribe seal are coupled to at least one bond pad 404 of the die 104, thereby allowing external electrical measurements to be made. In the embodiment shown in FIG. 4A, the inner wall 204 of the scribe seal and the detector test structure 202 are coupled to at least one bond pad 404 located within the active circuitry region. The bond pads 404 are configured to allow measurements to be taken after dicing and during subsequent stress testing. Measurements which deviate from expected electrical parameters indicate that damage has occurred to the scribe seal 202. For example, any measurement of capacitance that is not consistent with the materials present in the stack indicates damage to the scribe seal 202.

The exact structure of the scribe seal 202, in FIG. 4A, is not material to the invention. In alternative embodiments, the invention may be used with scribe seals comprising other numbers of walls and other wall structures.

Further, in FIG. 4A, the top view of the present invention shows that the detector test structure 402 is comprised of four different segments. In other embodiments of the invention, the detector test structure 402 is comprised of a larger or smaller number of segments. In such an embodiment, each segment of the detector test structure 402 is connected to a bond pad 404 that allows electric testing separately. In the above manner, not only can a problem be identified, but its general location can also be identified.

The exact form of the detector structure pictured in FIG. 4B is immaterial to the invention. As depicted in FIGS. 4A and 4B, the detector structure 402 would detect the so-called "gross" failure of the seal without regard to the exact layer in which such failure has occurred. It is conceivable that certain embodiments will utilize designs where the scribe seal associated with individual layers (e.g., first metal layer, second metal layer, etc.) can be monitored independently of one another, by having the detector test structure segmented into one or more independent monitoring layers. This is possible because each metal layer is typically separated from the via and metal layer above it by a thin dielectric barrier that helps to contain the Cu-based metallization within the trench structure forming the interconnect metallization. An embodiment utilizing a separate layer configuration would have a detector test structure lying only within a given metal layer and tied separately to its own bond pad connection (but separated by the metallization capping dielectric barrier). A drawback here is some potential loss in sensitivity should the crack propagate through the via layer rather than the metal layer; however, present Cu-based dual damascene process technology typically uses processes whereby via and metal layers are made without any separating dielectric barrier between them, so that such detection limitations may not be so severe. Thus, a generally localized and layer-specific identification of seal failure is possible and limited only by its measurability limits.

In one embodiment of the invention, shown in FIG. 4B, the detector test structure 402 does not electrically contact the substrate 210 of the integrated circuit chip die 104, therefore preventing shorting between the scribe seal 202 and the detector test structure 402. In an alternative embodiment where the detector test structure 402 is electrically coupled to the substrate 210 by way of a contact level, the capacitance, or another device-related feature using transistor circuitry that is impacted by impedance alteration by ambient exposure, is measured at the substrate to determine scribe seal integrity.

Figure 5:
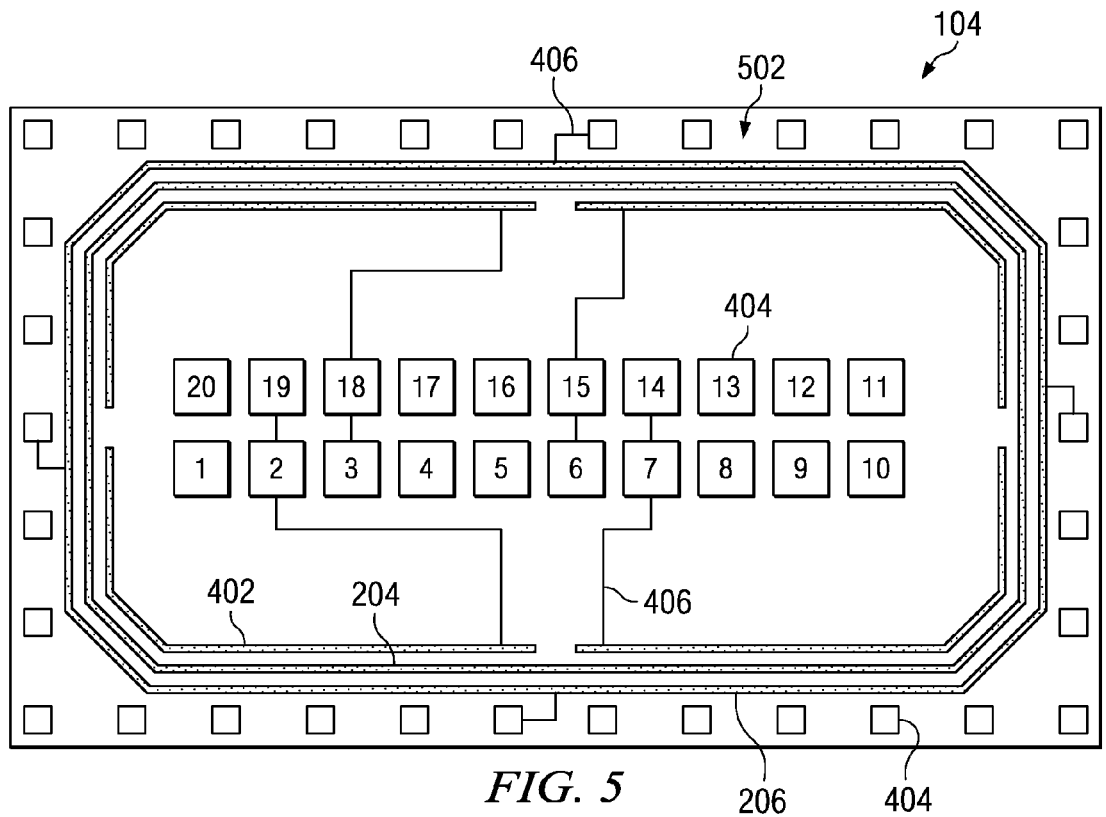
FIG. 5 shows an alternative embodiment, wherein a detector test structure is placed laterally adjacent to an inner wall of the scribe seal and electrical measurements are taken between the detector test structure and an outer wall of the scribe seal.

FIG. 5 shows an alternative embodiment of the present invention, wherein the electric measurements are detected between the outer wall 206 of the scribe seal and the detector test structure 402. In such an embodiment the outer wall 206 of the scribe seal 202 is electrically connected to bond pads 404 in the scribe line 502 located outside the scribe seal 202. The scribe line 502 is an area typically used for test structures.

Figure 6A:
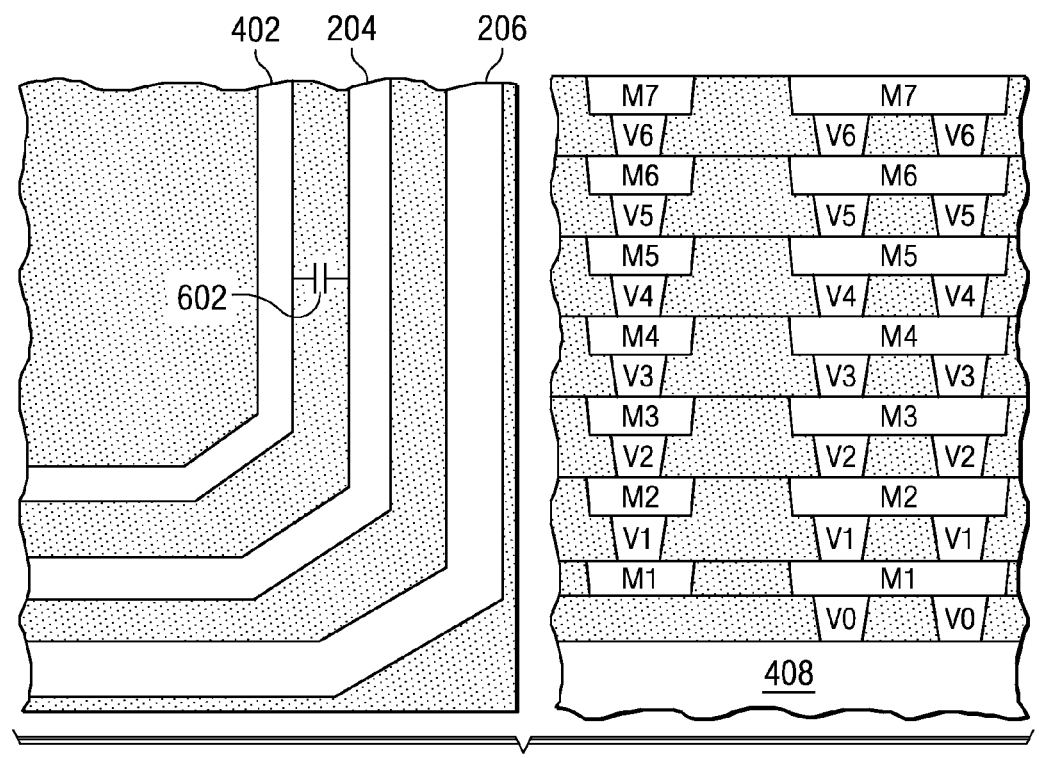
FIG. 6A shows a functional scribe seal, wherein there is a capacitance between the inner wall of the scribe seal and the detector test structure.
Figure 6B:
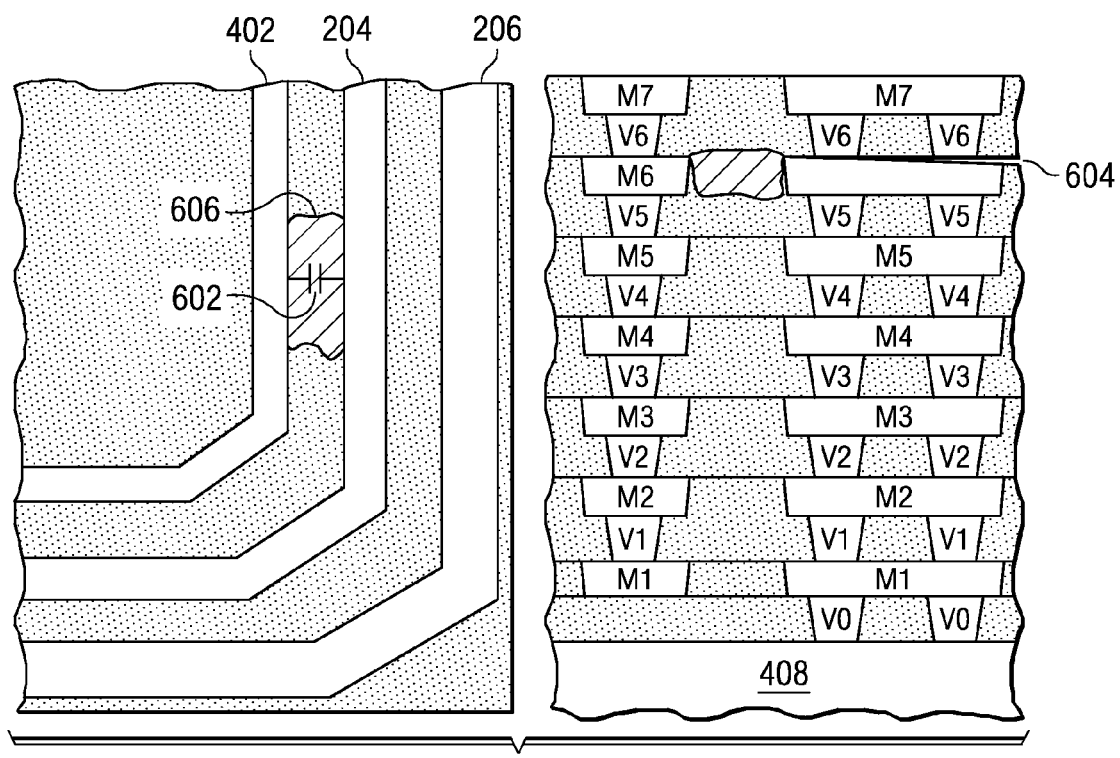
FIG. 6B shows a damaged scribe seal, wherein a crack has propagated through the inner wall of the scribe seal causing dielectric breakdown and shorting.

FIGS. 6A and 6B show a particular example of the invention applied to a damaged scribe seal. FIG. 6A shows a section of the scribe seal 202 and the detector test structure 402 for an undamaged scribe seal prior to dicing. The inner wall 204 of the scribe seal and the detector test structure 402 form a capacitor 602. If the capacitance and/or electrical leakage is measured between the inner wall 204 of the scribe seal and the detector test structure 402 it will substantially agree with expected results based upon the dielectric level characterization because there is no damage to the scribe seal.

FIG. 6B shows a similar section of the scribe seal 202 and detector test structure 402 for a damaged scribe seal after dicing. In FIG. 6B a crack or delamination 604 has propagated through the outer wall 206 and inner wall 204 of the scribe seal 202 causing moisture to enter into a damaged region 606. Measurement of the capacitance and/or electrical leakage between the inner wall 204 of the scribe seal and the detector test structure 402 gives a larger capacitance and/or electrical leakage value for the capacitor 602 indicating damage to the scribe seal 202.

In the invention, in general, in one embodiment any deviation from the expected characteristics of the dielectric material may indicate damage of the dielectric material between the inner wall of the scribe seal and the detector test structure, thereby indicating a hermeticity loss or mechanical failure. For example, in addition to the obvious potential for mechanical failure of metallic interconnections when cracks propagate into the electrically active regions of the die, the introduction of moisture between the detector test structure and the inner wall will increase the measured capacitance value since the introduction of water, having a dielectric constant of approximately 80 at room temperature compared to a low-k material which may have a dielectric constant of 2, would increase the measured capacitance value. Alternatively, an upper limit may be set for a tolerable leakage or capacitance so that any device that has degraded seal characteristics is deemed unsuitable for release to a customer.

Figure 7:
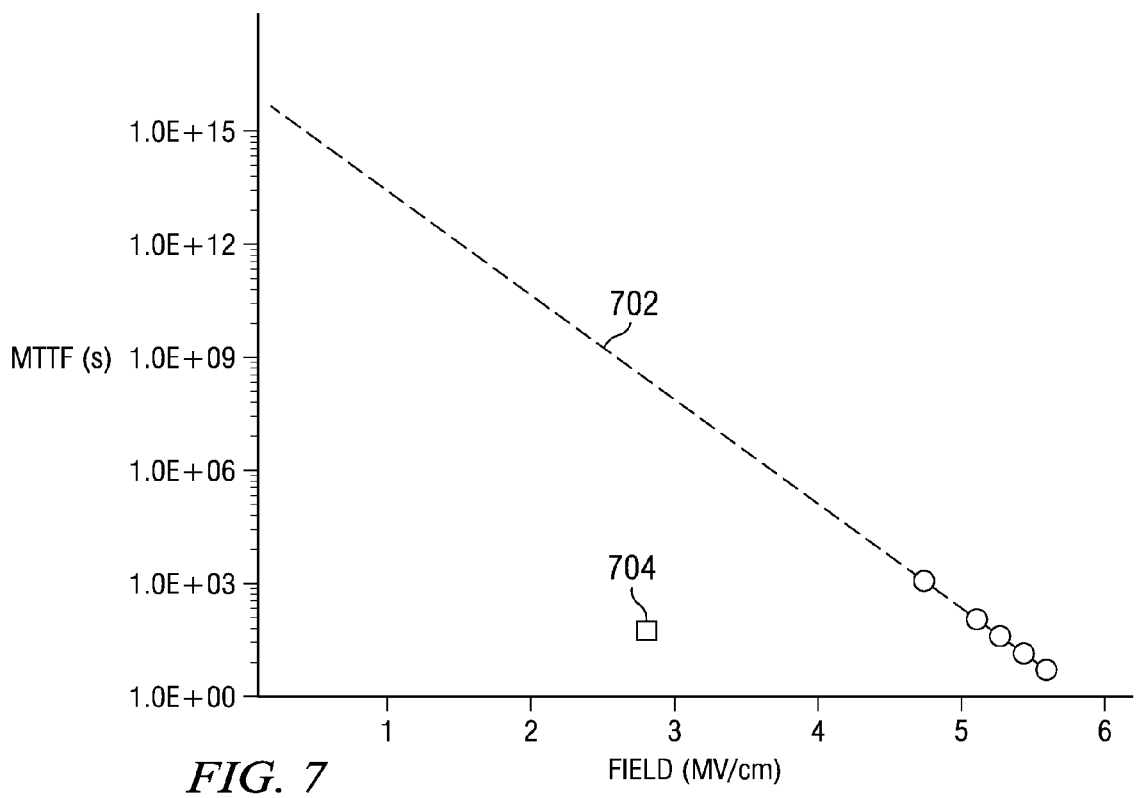
FIG. 7 shows a graph of the mean time to failure vs. the electric field for a dielectric material subjected to low moisture and a dielectric material subjected to high moisture.

The introduction of moisture also can have less apparent long term effects on the dielectric material of an integrated circuit chip. FIG. 7 shows a graph of the mean time to failure (MTTF) versus the field strength of a dielectric material held at ideal conditions and a dielectric material that has been exposed to moisture. Trend line 702 shows a test sample of a dielectric material in an optimized integration scheme. Data point 704 is associated with a test sample wherein the dielectric material was exposed to a significant amount of moisture. The dielectric material that has been exposed to moisture (i.e., data point 704) shows a MTTF that is nearly six orders of magnitude lower than the trend line 702 of a dielectric material held at ideal conditions. Therefore, if a crack propagates through the inner wall of the scribe seal and subjects the active region of the die to ambient moisture, the exposure of a low-k dielectric to moisture is a particular concern relating to time dependent dielectric breakdown (TDDB). When using dielectric materials with a low level of mechanical stability, as the low-k and ULK dielectric used in emerging technologies, it is advantageous to be able to detect micro-cracking through the scribe seal that may allow moisture to enter into the circuitry of the chip and subsequently to avoid the potential for product failure in the field.

Figure 8:
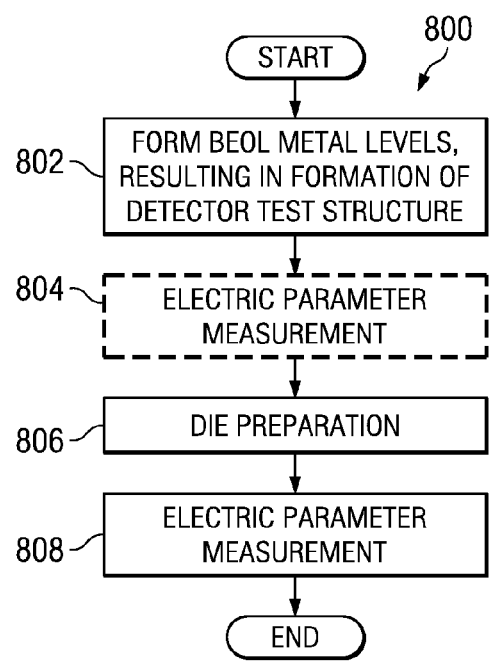
FIG. 8 shows a method for testing the electrical parameters of a scribe seal utilizing the structure of the invention.

FIG. 8 shows an additional embodiment of the present invention, a methodology 800 by which the scribe seal integrity detector can be used to monitor the scribe seal of an integrated circuit chip. While method 800 is illustrated and described below as a series of acts or events, it will be appreciated that the illustrated ordering of such acts or events is not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Furthermore, novel testing implementations (e.g., more complex testing methods meant to possibly improve on signal detection sensitivity) may also be utilized. For example, one conceivable testing implementation is the use of comparative electrical tests using "standard" or even arbitrary but similar dies to see if one die lies outside the electrical performance of the others. Such a scenario might be implemented, for example, using a Wheatstone bridge or other configuration to detect relative differences among the population of dies. For example, in a Wheatstone bridge configuration, four identical elements (e.g., comprising the bridge) are compared. A change in the signal at the bridge can indicate a change in the performance of one of the elements. Therefore, for example, if three dies are taken from the sample product population (e.g., similar products), the leakage or capacitance of the devices could be compared for changes after testing (e.g., reliability testing). Furthermore, such a configuration might be realizable on a single chip so that relative comparisons between different portions of the seal can be compared, where the different sections of the detector test structure of the chip are compared.

At 802, the back-end-of-line (BEOL) metal levels (e.g., thin and thick copper metal levels) are formed, resulting in a detector test structure laterally adjacent to the inner edge of a scribe seal facing a center portion of the integrated circuit chip die. The scribe seal further comprises inner and outer walls. The detector test structure and a wall of the scribe seal are each electrically connected to a bond pad as shown in FIG. 4A, for example.

The electrical parameters between the inner wall of the scribe seal and the detector test structure are optionally measured at 804. This step may be skipped in many embodiments, as the dielectric materials used in the back end of the line are well characterized and understood, and deviations from the expected measurement results should be easily detectable using only a post-dicing measurement.

At 806, die preparation is performed. During die preparation the wafer is mounted to a frame and attached to dicing tape. The wafer is then diced using a resin-bonded diamond blade operating at very high rotational speed (rpm). After dicing, the wafer is cleaned using deionized water in one embodiment. The wafer is then packaged. There are a number of different packages that can be used, as well as a number of adhesive materials for connecting the packages. The choice of material will depend on the application and demands of the chip. For example, the package may comprise a pressed alumina ceramic, a laminated alumina ceramic, or a molded package. All such variations are contemplated by the invention.

The electric parameters between the inner wall of the scribe seal and the detector test structure are measured at 808. In one embodiment, the measurements are performed in conjunction with other electrical measurements taken using automatic testing with automated test equipment. Generally, a test program is used for testing. Each test program may contain various test blocks that are used to test different device parameters under specific conditions. The measurements are compared to preset limits set in the test program and the chip is either rejected as a bad unit or accepted as a good unit.

Figure 9:
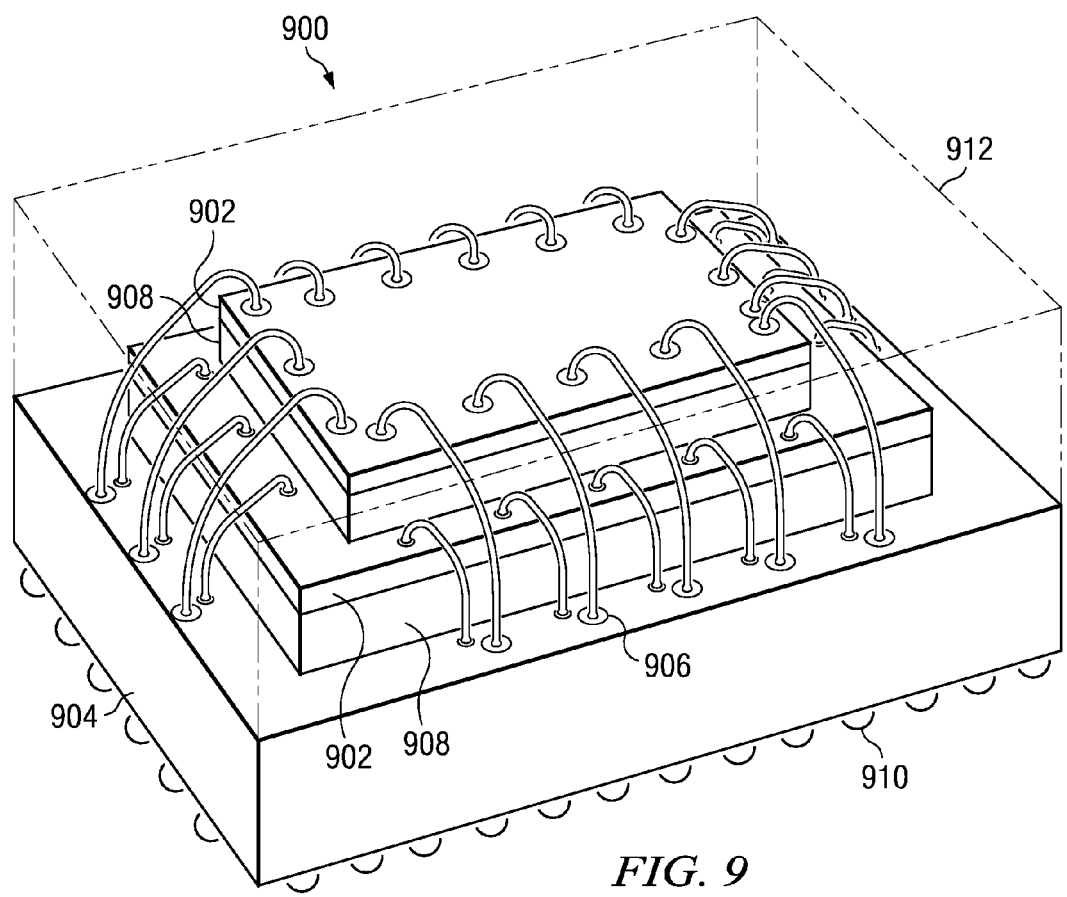
FIG. 9 shows a ball grid array (BGA) surface mount package comprising a scribe seal integrity detector of the present invention in an advanced three-dimensional chip stacking configuration, wherein multiple chips are stacked and bonded for electrical coupling between chips for increased functionality and performance.

An additional embodiment of the invention, shown in FIG. 9, is a ball grid array (BGA) package 900 utilizing the scribe seal integrity detector as described above in an advanced three-dimensional chip stacking configuration where multiple chips are stacked and bonded for electrical coupling between chips for increased functionality and performance. In this configuration, the loss of a single die to scribe seal integrity loss causes not just the failure of one chip but failure of a composite device consisting of three separate devices. The BGA package 900 comprises multiple thin silicon dies 902 stacked vertically on top of each other and wired to a ball grid array package interposer substrate 904 by wire bonds 906. The multiple thin silicon dies 902 are attached together using thin die attach films 908. The BGA package 900 further comprises a plurality of solder balls 910. The solder balls 910 are disposed on the lower surface of the ball grid array package interposer substrate 904 and electrically connected to the chips. A plastic overmold 912 covers the entire BGA package 900 in one embodiment.

BGA package 900 offers a number of advantages that are appealing to emerging technologies including high density and short interconnect distance. The same emerging technologies that will utilize ball grid arrays will also use mechanically weak low-k dielectric materials. Therefore, the need for a scribe seal integrity detector is especially important in ball grid arrays.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated example implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An integrated circuit chip die with a scribe seal integrity detector, comprising:
    a scribe seal that extends along at least a portion of a periphery of the integrated chip die, wherein the scribe seal comprises an inner wall, and wherein the inner wall further comprises vertically extending alternating levels of metal and via electrically contacting one another;
    a detector test structure located laterally adjacent to an inner edge of the inner wall of the scribe seal facing a center portion of the integrated chip die, wherein the detector test structure and the inner wall of the scribe seal are separated by one or more dielectric materials;
    a first electrical connection between the scribe seal and at least one bond pad; and
    a second electrical connection between the detector test structure and at least one bond pad located in an active circuitry region;
    wherein the detector test structure is comprised of a plurality of segments, each one of the plurality of segments electrically connected to a separate bond pad located in the active circuitry region; and
    wherein the inner wall of the scribe seal and the detector test structure are configured proximately to allow one or more electrical parameters associated therewith, and wherein the first and second electrical connections are configured to be accessed for a monitoring of the one or more electrical parameters, wherein the one or more electrical parameters provides an indication related to a scribe seal integrity of the scribe seal.

2. The integrated circuit chip die with scribe seal integrity detector of claim 1, wherein the scribe seal further comprises an outer wall, and wherein the outer wall of the scribe seal further comprises alternating levels of metal and via electrically contacting a substrate of the integrated circuit chip die.

3. The integrated circuit chip die with scribe seal integrity detector of claim 2, wherein the first electrical connection is between the outer wall of the scribe seal and at least one bond pad in a scribe line region located outside of the scribe seal.

4. The integrated circuit chip die with scribe seal integrity detector of claim 1, wherein the first electrical connection is between the inner wall of the scribe seal and at least one bond pad located in the active circuitry region.

5. The integrated circuit chip die with scribe seal integrity detector of claim 4, wherein at least one of the one or more dielectric materials is a low-k or ultra low-k dielectric material.

6. The integrated circuit chip die with scribe seal integrity detector of claim 4, wherein the one or more electric parameters is one or more of a capacitance, a leakage current under bias, or an AC electrical impedance measured between the inner wall of the scribe seal and the detector test structure segment, and wherein a deviation from an expected measurement result indicates damage to the scribe seal of the integrated circuit chip.

7. The integrated circuit chip die with scribe seal integrity detector of claim 4, wherein the inner wall of the scribe seal electrically contacts a substrate of the integrated circuit chip die.

8. The integrated circuit chip die with scribe seal integrity detector of claim 4, wherein the scribe seal integrity detector is comprised within a ball grid array package further comprising:
   a first die attached to the ball grid array package, wherein the first die is electrically connected to the ball grid array package by a plurality of wire bonds; and
   a second die attached to the first die, wherein the second die is electrically connected to the ball grid array package by a plurality of wire bonds;
   wherein each of the first die and the second die comprises the scribe seal integrity detector.

9. The integrated circuit chip die with scribe seal integrity detector of claim 1, wherein the plurality of segments comprises four segments.

10. An integrated circuit chip die with a scribe seal integrity detector, comprising:
    a scribe seal that extends along at least a portion of a periphery of the integrated chip die, wherein the scribe seal comprises an inner wall, and wherein the inner wall further comprises vertically extending alternating levels of metal and via electrically contacting one another;
    a detector test structure located laterally adjacent to an inner edge of the inner wall of the scribe seal facing a center portion of the integrated chip die, wherein the detector test structure and the inner wall of the scribe seal are separated by one or more dielectric materials;
    a first electrical connection between the scribe seal and at least one bond pad; and
    a second electrical connection between the detector test structure and at least one bond pad located in an active circuitry region;
    wherein the detector test structure is segmented into one or more independent monitoring layers respectively located within a metal layer and electrically connected to separate bond pads, each of the one or more independent monitoring layers configured to independently monitor the scribe seal integrity of the scribe seal for only the associated metal layer; and
    wherein the inner wall of the scribe seal and the detector test structure are configured proximately to allow one or more electrical parameters associated therewith, and wherein the first and second electrical connections are configured to be accessed for a monitoring of the one or more electrical parameters, wherein the one or more electrical parameters provides an indication related to a scribe seal integrity of the scribe seal.

11. An integrated circuit chip die with a scribe seal integrity detector, comprising:
    a scribe seal that extends along at least a portion of a periphery of the integrated chip die, wherein the scribe seal comprises an inner wall, and wherein the inner wall further comprises vertically extending alternating levels of metal and via electrically contacting one another;
    a detector test structure located laterally adjacent to an inner edge of the inner wall of the scribe seal facing a center portion of the integrated chip die, wherein the detector test structure and the inner wall of the scribe seal are separated by one or more dielectric materials;
    a first electrical connection between the scribe seal and at least one bond pad; and
    a second electrical connection between the detector test structure and at least one bond pad located in an active circuitry region;
    wherein the first electrical connection is between the inner wall of the scribe seal and at least one bond pad located in the active circuitry region;
    wherein the detector test structure further comprises alternating levels of metal and via electrically isolated from the substrate of the integrated circuit chip die; and
    wherein the inner wall of the scribe seal and the detector test structure are configured proximately to allow one or more electrical parameters associated therewith, and wherein the first and second electrical connections are configured to be accessed for a monitoring of the one or more electrical parameters, wherein the one or more electrical parameters provides an indication related to a scribe seal integrity of the scribe seal.

12. An integrated circuit chip die including a scribe seal integrity detector, comprising:
    active circuitry;
    a scribe seal structure at least partially encompassing the active circuitry; the scribe seal structure comprising vertically extending alternating levels of dielectric material with metal and metal-filled vias electrically contacting one another;
    a test structure at least partially encompassing the active circuitry and spaced laterally from the scribe seal structure toward the active circuitry; the test structure comprising vertically extending alternating levels of dielectric material with metal and metal-filled vias electrically contacting one another;
    dielectric material separating the scribe seal structure and the test structure; and
    at least one bond pad respectively electrically coupled to each of the scribe seal structure and the test structure;
    wherein the test structure comprises four segments, each segment coupled to a respective different bond pad; and
    wherein the scribe seal structure and the test structure are configured so that electrical measurements taken across the respective at least one bond pads can be used to determine an integrity of the scribe seal of the die.

13. The integrated circuit chip die of claim 12, wherein the scribe structure electrically contacts a semiconductor substrate not contacted by the test structure.

14. The integrated circuit chip die of claim 12, wherein at least some of the vertically extending alternating levels of dielectric material with metal and metal-filled vias of at least one of the scribe structure or the test structure comprise dual damascene copper structures.

15. An integrated circuit chip die including a scribe seal integrity detector, comprising:
   active circuitry;
   a scribe seal structure at least partially encompassing the active circuitry; the scribe seal structure comprising vertically extending alternating levels of dielectric material with metal and metal-filled vias electrically contacting one another;
   a test structure at least partially encompassing the active circuitry and spaced laterally from the scribe seal structure toward the active circuitry; the test structure comprising vertically extending alternating levels of dielectric material with metal and metal-filled vias electrically contacting one another;
   dielectric material separating the scribe seal structure and the test structure; and
   at least one bond pad respectively electrically coupled to each of the scribe seal structure and the test structure;
   wherein the seal structure comprises an inner wall structure and an outer wall structure, each comprising vertically extending alternating levels of dielectric material with metal and metal-filled vias, and at least one of the inner and outer wall structures is coupled to the respective at least one bond pad; and
   wherein the scribe seal structure and the test structure are configured so that electrical measurements taken across the respective at least one bond pads can be used to determine an integrity of the scribe seal of the die wherein the test structure comprises segments; each segment is coupled to a respective different bond pad; and the inner wall structure is coupled to the respective at least one bond pad.

16. The integrated circuit chip die of claim 15, wherein the outer wall structure is also coupled to a respective at least one bond pad.

17. The integrated circuit chip die of claim 16, wherein the active circuitry is located in an active circuitry region; the scribe seal structure is located in a scribe seal region; each segment is coupled to a bond pad in the active circuitry region; the inner wall structure is coupled to a bond pad in the active circuitry region; and the outer wall structure is coupled to a bond pad in the scribe region.

18. The integrated circuit chip die of claim 15, wherein the active circuitry is located in an active circuitry region; the scribe seal structure is located in a scribe seal region; the test structure is coupled to a bond pad in the active circuitry region; and the inner wall structure is coupled to a bond pad in the active circuitry region.

19. The integrated circuit chip die of claim 15, wherein the active circuitry is located in an active circuitry region; the scribe seal structure is located in a scribe seal region; the test structure is coupled to a bond pad in the active circuitry region; and the outer wall structure is coupled to a bond pad in the scribe seal region.

* * * * *